United States Patent [19]

Young

[11] 4,062,749

[45] Dec. 13, 1977

[54] METHOD OF FORMING A THIN FILM CAPACITOR WITH A MANGANESE DIOXIDE LAYER

[75] Inventor: Peter L. Young, Horseheads, N.Y.

[73] Assignee: Corning Glass Works, Corning, N.Y.

[21] Appl. No.: 656,523

[22] Filed: Feb. 9, 1976

[51] Int. Cl.² .............................................. C23C 15/00
[52] U.S. Cl. .............................. 204/192 SP; 29/25.42;
204/192 D; 361/313
[58] Field of Search ..................... 204/192 SP, 192 D;
29/25.42, 570; 317/258

[56] References Cited

U.S. PATENT DOCUMENTS 3,969,197  7/1976  Tolar et al. ............................. 204/15

OTHER PUBLICATIONS

I. H. Pratt, "Thin-Film Dielectric Properties of RF Sputtered Oxides", *Solid State Technology*, Dec. 1969, pp. 49–57.

*Primary Examiner*—G. L. Kaplan
*Assistant Examiner*—Aaron Weisstuch
*Attorney, Agent, or Firm*—Walter S. Zebrowski; Clarence R. Patty, Jr.

[57] ABSTRACT

A method of forming a thin film capacitor having a tantalum oxide dielectric is described. A dielectric substrate having an electrically conductive film electrode formed thereon is provided and a layer of manganese dioxide is applied over the conductive film. The composite so formed is disposed within an oxygen-inert gas containing vacuum environment. A film of tantalum oxide is applied over the manganese dioxide layer by r-f sputtering of a tantalum oxide target within the vacuum environment while the dielectric substrate, conductive film, and manganese dioxide layer are being cooled. The composite may then be removed from the oxygen-inert gas containing vacuum environment and a second electrically conductive film electrode applied over the so-formed tantalum oxide film.

9 Claims, 5 Drawing Figures

METHOD OF FORMING A THIN FILM CAPACITOR WITH A MANGANESE DIOXIDE LAYER

BACKGROUND OF THE INVENTION

1. Field of the Invention

The present invention relates to a method of forming a thin film capacitor having a tantalum oxide dielectric and a manganese dioxide layer.

2. Description of the Prior Art

In the manufacture of thin film capacitors, it has heretofore been necessary to first form a thin film of tantalum as the first electrode on a dielectric substrate. This composite would then be placed in an anodizing bath to form a layer of tantalum oxide on the tantalum film, which procedure required an abnormally long period of time, thereby adding greatly to the cost of manufacturing a capacitor. Capacitors produced by such methods required the use of tantalum metal, which itself added greatly to the cost thereof. Further, when in the past a definite capacitor pattern was required, complicated and time consuming photolithographic, or like techniques were required to produce well defined edges to reduce edge effect problems.

Prior art efforts to form tantalum oxide dielectric layers on non-tantalum electrodes resulted in a significant change in the value of breakdown voltage with the resultant reduction of capacitance and the increase in electrical series resistance.

It has also been known in the prior art to dispose a film or layer of manganese dioxide over the tantalum oxide dielectric to improve both the working voltage as well as the yield of relatively large area capacitors. However, two severe problems have been encountered with the use of manganese dioxide films over the tantalum oxide dielectric film. First, the loss tangent of the capacitors with manganese dioxide layers is substantially higher than conventional tantalum oxide film capacitors. Secondly, the temperature coefficient of capacitance is significantly increased with the use of a manganese dioxide layer. It is generally believed that the first problem and to some extent the second problem are due to the high resistivity of the manganese dioxide layer. Although manganese dioxide layers or films can be prepared with resistivities lower than 0.1 ohm-cm., deposition methods that are compatible with tantalum oxide film capacitor fabrication, that is, methods that do not cause irreparable damage to tantalum oxide films, generally yield manganese dioxide films with high resistivities of about 1000 ohm-cm.

SUMMARY OF THE INVENTION

An object of the present invention is to provide a method of forming a thin film capacitor having a low resistivity manganese dioxide layer applied by a process which will not cause irreparable damage to the capacitor dielectric.

Further objects of this invention are to provide a method for forming a thin film capacitor which is economical, does not produce a significant decrease in the value of breakdown voltage, reduces the time of fabrication, eliminates the need for use of elemental tantalum, precious metals, or other expensive metals, permits formation of any desired capacitor pattern, and one which overcomes the heretofore noted disadvantages.

Broadly, according to the present invention, a suitable dielectric substrate is provided, to which is applied an electrically conductive film electrode. A layer of manganese dioxide is applied directly over the conductive film. The substrate and conductive film is disposed within an oxygen-inert gas containing vacuum environment and a film of tantalum oxide of desired thickness is sputtered by r-f sputtering techniques over the manganese dioxide layer within the vacuum environment while the dielectric substrate, conductive film, and manganese dioxide layer are being cooled. The composite so formed may then be removed from said environment and an electrically conductive film counter electrode applied over the dielectric film.

Additional objects, features, and advantages of the present invention will become apparent to those skilled in the art from the following detailed description and the attached drawing in which, by way of example, only the preferred embodiment of this invention is illustrated.

DETAILED DESCRIPTION OF THE DRAWING

It is to be noted that the drawings are illustrative and symbolic of the invention, and there is no intention to indicate scale or relative proportions of the elements shown therein. For the purposes of simplicity, the present invention will be described in connection with the formation of a thin film type capacitor.

Figure 1:
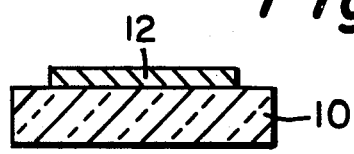
FIG. 1 is a cross-sectional view of a dielectric substrate with a first electrically conductive film electrode applied thereto.

Referring to FIG. 1 of the drawing, there is shown a dielectric substrate 10 to which is applied a non-tantalum electrically conductive film electrode 12. The material of dielectric substrate 10 may be any suitable dielectric material such as glass, ceramic, glass-ceramics, or the like. The material of electrode 12 may be any electrically conductive material which is compatible with tantalum oxide as well as compatible with the method of applying a film of tantalum oxide thereto, such as for example aluminum, nichrome, chromium, or the like.

Figure 2:
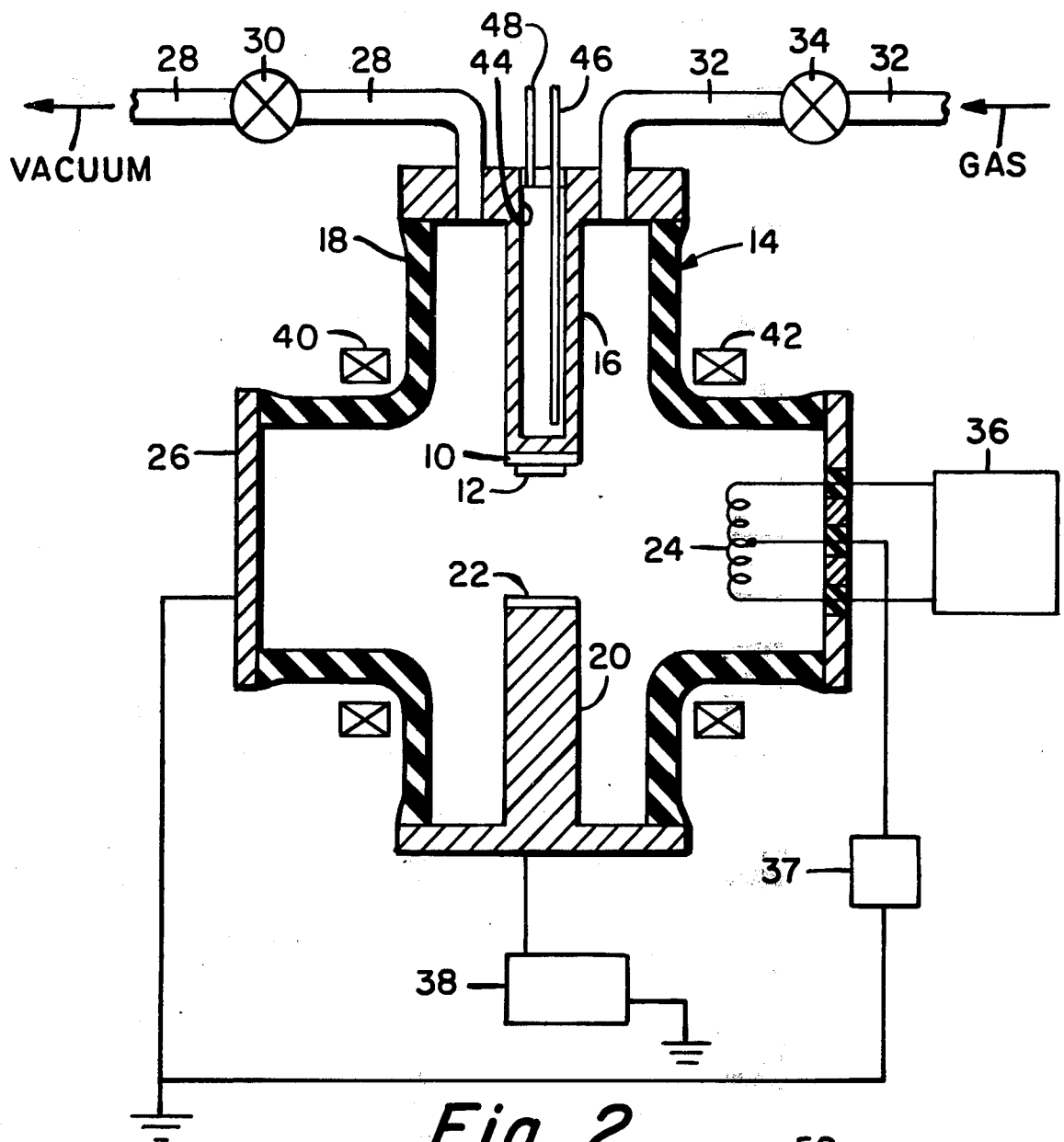
FIG. 2 is a diagrammatic cross-sectional view of an r-f sputtering apparatus suitable for use in the method of the present invention.

Referring also to FIG. 2, the composite so formed may be disposed within a typical r-f sputtering apparatus 14. Apparatus 14 consists of a substrate holder 16 attached to one opening of apparatus housing 18. Adjacent and opposite to substrate holder 16 is target holder 20 attached to housing 18 at another opening therein. Target material 22 is disposed on holder 20 and is generally held in place by gravity, whereas substrate 10 and electrode 12 are disposed on substrate holder 16 and generally held in place by peripheral or exterior means such as clamps, or the like, not shown.

A filament cathode 24 is disposed within housing 18 while anode 26 is disposed over still another opening in housing 18. A vacuum pump, not shown, or other vacuum means is connectable to housing 18 by means of conduit 28 through control valve 30. A source of inert ionizable gas and oxygen, not shown, is also connectable to apparatus housing 18 through conduit 32 and control valve 34. Electron producing filament cathode 24 is connected to a suitable dc power source 36 while anode 26 is illustrated connected to filament cathode 24 through a suitable dc power source 37. Target holder 20 is connected to a suitable r-f power source 38. A pair of magnetic coils 40 and 42 are disposed about the exterior of apparatus housing 18 and are also connected to a suitable source of electrical energy, not shown. A suitable quantity of coolant may be disposed within or circulated within cavity 44 of substrate holder 16. As illustrated in FIG. 2, a quantity of suitable coolant, such for example as water, may be circulated through cavity 44 by means of inlet and outlet conduits 46 and 48. Solid coolants, such as ice or dry ice, may be disposed within cavity 44 if desired.

Figure 3:
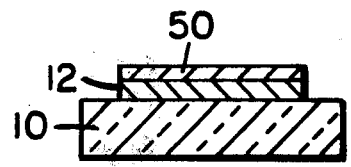
FIG. 3 is a cross-sectional view of the composite of FIG. 1 over which electrode a manganese dioxide film has been applied.
Figure 4:
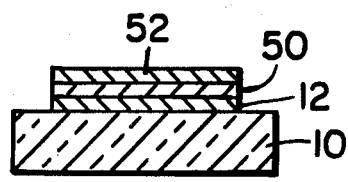
FIG. 4 is a cross-sectional view of the composite of FIG. 3 over which manganese dioxide film a dielectric film has been applied.
Figure 5:
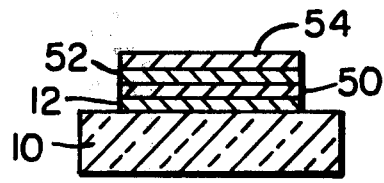
FIG. 5 is a cross-sectional view illustrating a capacitor formed by the present method.

The dielectric substrate-electrode composite of FIG. 1 is disposed on substrate holder 16 while a quantity of manganese dioxide 22 is disposed on target holder 20 within housing 18. Housing 18 is then sealed and a predetermined desired vacuum is drawn therein. The amount of vacuum drawn depends on the materials involved in the sputtering as well as, to some extent, on the electrical parameters of the various parts of the apparatus. A quantity of a mixture of an inert ionizable gas and oxygen is then introduced into housing 18, reducing the vacuum to a predetermined desired level. One familiar with the art can readily select a suitable level of vacuum for a specific set of parameters. For the purposes of the present invention a range of oxygen-inert gas mixture ratios ranging from about 5 percent to about 20 percent by volume of oxygen is suitable. The ionizable gas may be any suitable inert ionizable gas such as argon, xenon, krypton, or the like. A plasma is then initiated by means of filament cathode 24, anode 26, and dc power sources 36 and 37, while suitable r-f energy is applied to target material 22 by r-f power source 38. A quantity of coolant such as water, for example, may be circulated within cavity 44 of substrate holder 16. When used, any coolant at a temperature of about 12° C or lower is suitable for the present invention. If desired, magnetic coils 40 and 42 may be energized to focus the plasma. Under these described conditions, target material 22 will be caused to sputter and be applied over electrode 12 on substrate 10. When desired, a mask may be interposed over electrode 12 to pattern the application of the target material on electrode 12. Such a mask is not shown, however, its nature will be readily understood by one familiar with the art. After a suitable time period of sputtering, a layer or film 50 of target material 22 will be applied to electrode 12 as illustrated in FIG. 3. As heretofore described, the target material will be manganese dioxide, $MnO_2$, which will comprise one of the capacitor layers. Although, as heretofore described, the manganese dioxide layer may be applied by r-f sputtering, it will be understood that the manganese dioxide layer for the purposes of the present invention may be applied by any technique which produces a stoichiometric, low resistivity layer including such methods, for example, as chemical pyrolysis, chemical reduction, or the like. The means of applying the manganese dioxide layer is not critical for the purposes of the present invention. However, if the manganese dioxide layer is applied by r-f sputtering, target material 22 will then be changed to tantalum oxide for the next step of the present process. Tantalum oxide may be applied by the r-f sputtering process described in connection with the manganese dioxide layer except that oxygen-inert gas mixture ratios between about 1 percent and 10 percent by volume of oxygen are preferred and a coolant at a temperature of about $-70°$ C or lower, such as dry ice, must be used. The methods of applying tantalum oxide described in my copending applications Ser. No. 656,525, now U.S. Pat. No. 4,002,542 and Ser. No. 656,527, respectively entitled "Thin Film Capacitor and Method" and "Method of Forming a Thin Film Capacitor", both filed on even date herewith, are suitable for applying tantalum oxide in the present method. Both of these applications are hereby expressly incorporated herein by reference. Accordingly, a layer or film 52 of target material 22 will then be applied over the manganese dioxide layer 50 as illustrated in FIG. 4. The resulting layer 52 of tantalum dioxide will comprise the thin film capacitor dielectric. In the ordinary formation of a $Ta_2O_5$ film by r-f sputtering, the resulting film will be non-stoichiometric, that is it will be somewhat oxygen deficient. A capacitor formed with such a non-stoichiometric dielectric film will be lossy, that is, it will have a high loss tangent, and will have a high leakage current. As will be understood, a capacitor under these conditions will have a decreased breakdown voltage. A description of such problems is set out in my copending application entitled "Thin Film Capacitor and Method", Ser. No. 656,525 now U.S. Pat. No. 4,002,542 filed on even date herewith. It has been found that sputtering $Ta_2O_5$ in an oxygen containing vacuum environment cures the non-stoichiometric condition of layer 52, that is, the resulting $Ta_2O_5$ layer or film is not oxygen deficient, whereupon the leakage current and the loss tangent of the capacitor is reduced and its breakdown voltage is significantly increased. The capacitor may then be removed from the vacuum environment and a counter electrode 54 applied over dielectric film 52 as shown in FIG. 5. Counter electrode 54 may be applied within the vacuum environment if desired and if the equipment is adaptable to such application. Counter electrode 54 as well as electrode 12 can be applied by any suitable method known in the art, such as for example, physical vapor deposition, electron beam evaporation, or the like. Since electrode 12 and counter electrode 54 need not be formed of tantalum metal rather they may be formed of aluminum or the like, much cost of manufacturing the resulting product may be saved.

A typical example of the present invention is as follows. A 3000A thick layer of aluminum was deposited on a glass substrate by chemical vapor deposition to form the base electrode. The base electrode has an area of 5 $cm^2$. The substrate-electrode composite was placed in an r-f sputtering apparatus such as is illustrated in FIG. 2 and was attached to substrate holder 16 by means of suitable peripheral clamps. The aluminum electrode was exposed to a quantity of manganese dioxide disposed on a target holder adjacent and in opposition to the aluminum electrode. The r-f sputtering apparatus was secured and a vacuum of $10^{-6}$ Torr was drawn. A quantity of a mixture of oxygen and argon gas was then introduced into the apparatus until the vacuum environment reached $5 \times 10^{-3}$ Torr. The oxygen-inert gas mixture contained about 10 percent by volume of oxygen. A quantity of water was circulated through a cavity in the substrate holder to cool the substrate-electrode composite during sputtering. A plasma was created between the target holder and the aluminum electrode by both energizing the anode and filament dc power sources and by electrons which were emitted from a filament cathode and transmitted to the anode. The anode dc power source was energized to a voltage of 110 volts while the filament dc power source was energized to a voltage of about 20 volts. An r-f power source connected to the target holder and the manganese dioxide was energized whereupon the manganese dioxide was at a voltage of $-2000$ volts to ground at a frequency of 3.68 mHz. Under these conditions, manganese dioxide was caused to be sputtered from the target onto the surface of the aluminum electrode until a layer of $MnO_2$ having a thickness of 800A and an area of 5 cm.$^2$ was deposited on the aluminum film. The period of time required for sputtering such a thickness of manganese dioxide was about 20 minutes. The pressure in the sputtering chamber was then brought to ambient and the target material was changed to tantalum oxide. The manganese dioxide layer previously sputtered was exposed to the tantalum oxide target disposed on a target holder adjacent and in opposition thereto. The r-f sputtering apparatus was again secured and a vacuum of $10^{-6}$ Torr was drawn. A quantity of a mixture of oxygen and argon gas was then introduced into the apparatus until the vacuum environment reached $5 \times 10^{-3}$ Torr. The oxygen-inert gas mixture contained about 5% by volume of oxygen. A quantity of dry ice (solid $CO_2$) was disposed in the cavity in the substrate holder to cool the substrate-electrode-$MnO_2$ layer composite during sputtering. A plasma was created in between the target holder and the $MnO_2$ layer by both energizing the anode and filament dc power sources and by electrons which were emitted from a filament cathode and were transmitted to the anode. Both dc power sources were energized as for the manganese dioxide application. Another power source connected to the target holder and the tantalum oxide was energized whereupon the tantalum oxide was at a voltage of $-2000$ volts to ground at a frequency of 3.68 mHz. Under these conditions, tantalum oxide was caused to be sputtered from the target holder to the surface of the manganese dioxide layer until a layer of $Ta_2O_5$ having a thickness of 2300A and an area of about 5 cm.$^2$ was deposited thereon. The period of time required for sputtering such a thickness of tantalum oxide was about 20 minutes. The temperature of the substrate-electrode-$MnO_2$-tantalum oxide composite was allowed to return to substantially ambient and the environment within the chamber was brought to atmospheric pressure by introducing nitrogen gas therein. The composite was removed from the sputtering apparatus and five counter electrodes each having an area of 0.195 cm$^2$ of aluminum were vapor deposited onto the dielectric film of tantalum oxide. The resulting capacitors each had a capacitance of 1200 ufd. and a catastrophic breakdown voltage of over 80 volts. The loss tangent at 1kHz was 0.5 percent and the leakage current at 25 volts was below $10^{-9}$ amp.

It is to be noted that the only tantalum used in the construction of such a capacitor was the tantalum embodied in the tantalum oxide dielectric. The plurality of counter electrodes were deposited as in commercial practice, the composite being capable of being subsequently cut apart into individual capacitor units as desired.

Although the present invention has been described with respect to details of certain embodiments thereof, it is not intended that such details be limitations upon the scope of the invention except insofar as set forth in the following claims.

I claim:

1. A method of forming a capacitor comprising the sequential steps of
    providing a dielectric substrate,
    applying to said dielectric substrate an electrically conductive film to form a first capacitor electrode,
    applying a layer of manganese dioxide over said electrically conductive film,
    disposing said substrate and conductive film within a vacuum environment containing an oxygen-inert gas mixture,
    r-f sputtering a film of tantalum oxide of desired thickness over said layer of manganese dioxide within said vacuum environment, said tantalum oxide being sputtered from a tantalum oxide target,
    cooling said dielectric substrate, conductive film and layer of manganese dioxide while said film of tantalum oxide is being sputtered thereon, and thereafter
    applying an electrically conductive film over said film of tantalum oxide to form a counter capacitor electrode.

2. The method of claim 1 wherein said oxygen and inert gas mixture comprises at least about 5 percent by volume of oxygen.

3. The method of claim 1 wherein one of said electrically conductive films is formed of aluminum.

4. The method of claim 3 wherein the other of said electrically conductive films is formed of aluminum.

5. The method of claim 4 wherein said oxygen and inert gas mixture comprises at least about 5 percent by volume of oxygen and said vacuum environment has a pressure of about $5 \times 10^{-3}$ Torr.

6. The method of claim 5 wherein at least one of said electrically conductive aluminum films is applied by vapor deposition.

7. The method of claim 1 wherein said layer of manganese dioxide is applied by sputtering within said oxygen-inert gas mixture.

8. The method of claim 1 wherein said vacuum environment has a pressure of about $5 \times 10^{-3}$ Torr.

9. A thin film capacitor formed by the method of claim 1.

* * * * *